United States Patent [19]

Hayes

[11] 4,173,766
[45] Nov. 6, 1979

[54] INSULATED GATE FIELD-EFFECT TRANSISTOR READ-ONLY MEMORY CELL

[75] Inventor: James A. Hayes, Mountain View, Calif.

[73] Assignee: Fairchild Camera and Instrument Corporation, Mountain View, Calif.

[21] Appl. No.: 834,017

[22] Filed: Sep. 16, 1977

[51] Int. Cl.² .............................................. H01L 29/76
[52] U.S. Cl. ........................................ 357/23; 357/54; 357/41; 357/45
[58] Field of Search ......................... 357/23, 41, 45, 54

[56] References Cited
U.S. PATENT DOCUMENTS 4,017,888  4/1977  Christie et al. ......................... 357/54

Primary Examiner—Edward J. Wojciechowicz
Attorney, Agent, or Firm—Alan H. MacPherson; Robert C. Colwell

[57] ABSTRACT

A read-only memory cell formed from a single insulated gate field-effect transistor may be selectively programmed by being operated under suitable biasing conditions to cause some of the electrons flowing between the source and drain to acquire sufficient energy to be injected into and trapped in the insulating material separating the channel from the gate electrode. The trapped electrons cause a change in the current-voltage characteristics of the transistor which may be detected during reading of the memory cell most easily by reversing the polarity of the source and the drain. An array of such cells may be utilized as a ROM, PROM or EPROM.

7 Claims, 12 Drawing Figures

PRIOR ART - MNOS

PRIOR ART - FAMOS TYPE

70

80

INSULATED GATE FIELD-EFFECT TRANSISTOR READ-ONLY MEMORY CELL

BACKGROUND OF THE INVENTION

1. Field of the Invention

This invention relates to read-only memories, programmable read-only memories, and erasable programmable read-only memories, and in particular to read-only memories fabricated from insulated gate field-effect transistors in which information is stored by the phenomena of hot electron trapping.

2. Prior Art

A random access memory (hereinafter RAM) is an array of latches, each with a unique address, having an addressing structure which is common for both reading and writing. Data stored in most types of RAM's is volatile because it is stored only as long as power is supplied to the RAM. A read-only memory (hereinafter ROM) is a circuit in which information is stored in a fixed, nonvolatile manner; that is, the stored information remains even when power is not supplied to the circuit. By convention, a ROM is a circuit in which information is stored by alterations made during fabrication or processing of the semiconductor wafer, while a programmable read-only memory (hereinafter PROM) is one in which the information is stored after the device is fabricated and packaged. Erasable programmable read-only memories (hereinafter EPROM's) are PROM's which can be completely erased and reprogrammed. EPROM's typically have been fabricated from arrays of MOS transistors.

Electrically programmable ROM's fabricated using insulated gate field-effect transistors (hereinafter IGFET) have typically been of two different types. One type of electrically programmable ROM is the metal nitride oxide semiconductor structure (hereinafter MNOS). Such structures rely on charge tunneling phenomena and have been described in numerous publications. See, for example, "*IEEE Transactions on Electron Devices*", May 1977, Volume ED24, Number 5. (A special issue on nonvolatile semiconductor memories.)

A typical MNOS structure is shown in FIG. 1. Such a structure utilizes a very thin layer of insulating material, typically silicon dioxide, to separate a silicon nitride region and a gate electrode from the channel of the device. MNOS devices are programmed by applying a positive potential to the gate electrode while holding the source, drain, and substrate regions at a lower potential. This causes electrons in the substrate and channel regions to "tunnnel" vertically through the oxide layer and lodge in the nitride layer.

For the electrons to tunnel through the oxide, the oxide layer must be very thin, typically on the order of 20 to 30 angstroms. In addition, the electric field in the gate insulating region must be very high for efficient tunneling. The high electric field requires the use of high voltages and a relatively thin nitride layer, typically on the order of 500 angstroms.

Accurate control of the thickness of the thin silicon dioxide layer has proven difficult in a production environment, as has control of the silicon nitride film properties. Also, the high electric field required for tunneling can easily cause permanent damage to the memory cells or to peripheral circuitry, thereby reducing the yield of such devices and increasing their costs. In addition, movement of charge within the nitride and tunneling of the electrons trapped in the nitride layer back through the thin oxide can change or destroy the information stored in the device, ruining its effectiveness.

MNOS structures typically use expitaxial substrates and isolation diffusions to isolate each memory cell or groups of memory cells, depending upon the desired array organization, from surrounding cells or other peripheral circuitry. Because the tunneling effect is uniform across the full width of the gate electrode, the electrons trapped in the nitride will be almost uniformly distributed across the width of the silicon nitride layer. This results in electrically symmetrical device operation because device operation is not affected by source and drain terminal interchanges.

Another type of memory element used in forming electrically programmable ROM's is the field alterable MOS transistor structure, also known as a floating gate structure (hereinafter FAMOS type). Such structures are well known. See, for example, U.S. Pat. No. 3,500,142 entitled FIELD EFFECT SEMICONDUCTOR APPARATUS WITH MEMORY INVOLVING ENTRAPMENT OF CHARGE CARRIERS issued to D. Kahng, and D. Frohman-Bentchkowsky, *Applied Physics Letter*, vol. 18, page 332, 1971. An example of a FAMOS type structure is shown in FIG. 2. FAMOS type structures utilize a charge injection phenomenon in which a control gate and drain electrodes are biased to cause electrons flowing between the source and drain to pass from the substrate and collect on the floating gate electrode. The electron's momentum from the source to the drain causes most of them to be injected onto the portion of the floating gate electrode nearest the drain. Because the floating gate electrode is conductive, the electrons spread out on the floating gate as they repel each other, thereby preserving electrical symmetry with respect to the source and drain terminals.

Unfortunately, the FAMOS structure suffers from several disadvantages. A relatively thin layer of oxide or insulating material must be formed between the floating gate electrode and the control electrode. This requires carefully controlled manufacturing processes resulting in lower yields and higher costs. Additionally, programming the FAMOS structure requires relatively high voltages, for example, on the order of 25 to 30 volts. Such high voltages can cause excessive parasitic conduction and/or rupture of the thin films formed elsewhere on the wafer. Further, the high voltages required increase the complexity of the structure of the device because the source and drain must be formed with carefully controlled concentration profiles to ensure pn junction breakdown at the desired high voltages.

It has been discovered, and observed to be a limitation in IGFET design, that under appropriate biasing conditions electrons flowing between the source and drain of an IGFET can acquire sufficient energy to be injected into the insulating material between the gate electrode and the channel. Some of the injected electrons are trapped in the insulating material near the drain, causing a change in the current-voltage characteristics of the IGFET, and creating an electrically asymmetrical structure sensitive to source/drain terminal interchanges. This effect is discussed in an article entitled "N-Channel IGFET Design Limitations Due to Hot Electron Trapping", by S. A. Abbas and R. C. Dockerty, and published in the IEDM Proceedings, Washington, D.C., 1975. Abbas and Dockerty explain that the electrons flowing between the source and drain of an IGFET may under certain conditions undergo randomizing scattering motions which cause them to move toward the interface between the silicon substrate and overlying silicon dioxide layer. Some fraction of the electrons arriving at this interface have sufficient energy to be injected into the insulating material and trapped to cause a change in the operating characteristics of the particular transistor. Abbas and Dockerty observe that the change in operating characteristics is most evident when the transistor is operated in a reverse mode, that is, with the source and drain interchanged.

SUMMARY OF THE INVENTION

Applicants have discovered that the phenomenon of hot electron trapping may be utilized to fabricate an improved IGFET memory cell. One or more cells may be fabricated with well-known MOS technology and may be programmed electrically by applying suitable potentials to its source, drain and gate electrodes. By biasing the IGFET into its pinch-off region, hot electrons are generated and injected, rather than tunnel, from the channel into the gate insulating material where they are trapped. The trapped electrons cause a shift in the current-voltage characteristics of the IGFET which is greatest if the IGFET is programmed in one mode and operated in the opposite mode, that is, with the source and drain terminals reversed. The change in current-voltage characteristics of individual cells can be representative of information.

The IGFET memory cell of this invention may be fabricated simply according to well-known MOS fabrication processes. Because the memory cell is simple in design it occupies a relatively small amount of wafer surface area, allowing large, dense arrays. Also, unlike prior-art MNOS and FAMOS type devices, no particularly thin regions of insulating material are required. This allows higher yields, lower cost, and greater reliability.

The memory cells of this invention may be arranged in a variety of arrays to create ROM's, PROM's and EPROM's. In one embodiment of such an array, a plurality of IGFET's each have a source connected to a single common line, a gate connected to one of a plurality of x lines and a drain connected to one of a plurality of y lines. By application of appropriate signals to the common line and the x and y lines, information may be stored in any desired IGFET and later retrieved.

In another embodiment, a plurality of IGFET's each has a gate connected to one of a plurality of i lines, a source connected to one of a plurality of j lines, and a drain connected to one of a plurality of k lines. By application of suitable signals to the i, j, and k lines, information may be stored in and later retrieved from any desired cell. Further advantages of the individual cell and arrays of such cells will be apparent from the detailed description which follows.

DETAILED DESCRIPTION

Figure 1:
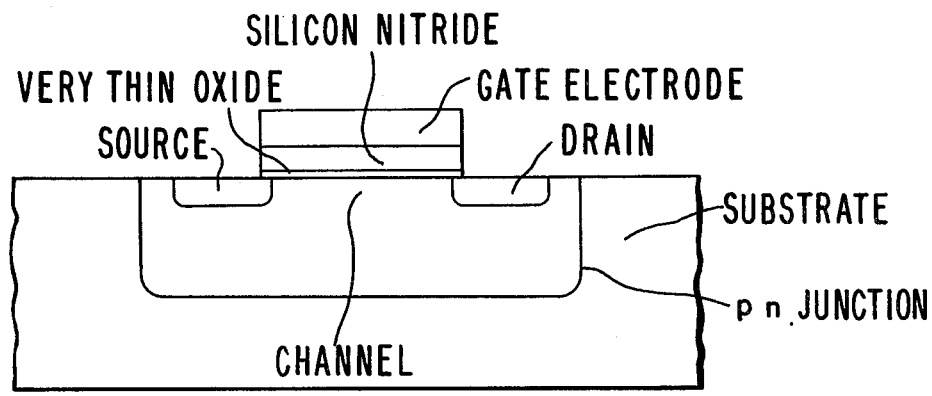
FIG. 1 is a cross-sectional view of a prior-art MNOS structure.

FIG. 1 is a cross-sectional view of an MNOS structure of the prior art. In this structure a very thin layer of oxide, on the order of 20 to 30 angstroms thick, is formed over the channel region of the transistor and beneath the gate electrode. Typically, a 500 angstrom thick region of silicon nitride is formed on the upper surface of the very thin oxide. To isolate the MNOS cell from any others formed on the same substrate a pn junction as shown in FIG. 1 must surround the memory cells. The disadvantages of this structure have already been discussed.

Figure 2:
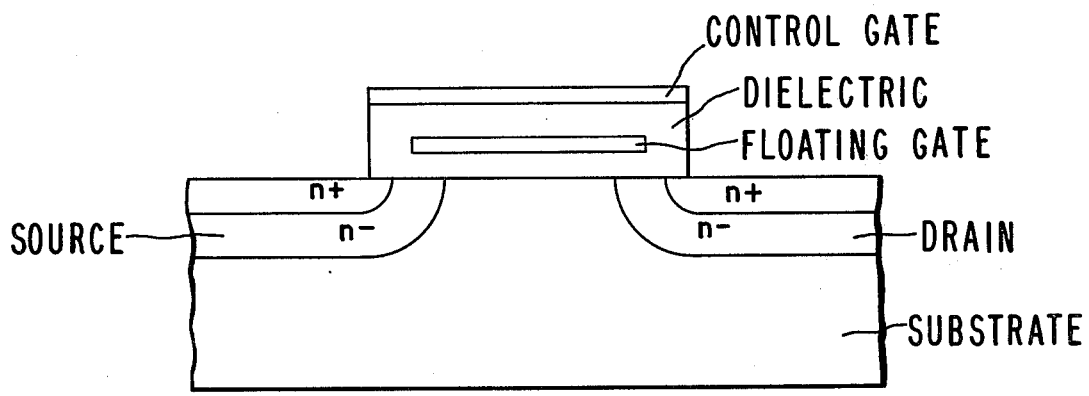
FIG. 2 is a cross-sectional view of a prior-art FAMOS type structure.

FIG. 2 is a cross-sectional view of a FAMOS type prior-art structure. In the FAMOS type structure, a floating gate, that is, a thin conductive region isolated from both the channel and the control gate electrode, is used to store a charge which later may be sensed. The disadvantages of the FAMOS structures have already been discussed.

Figure 3:
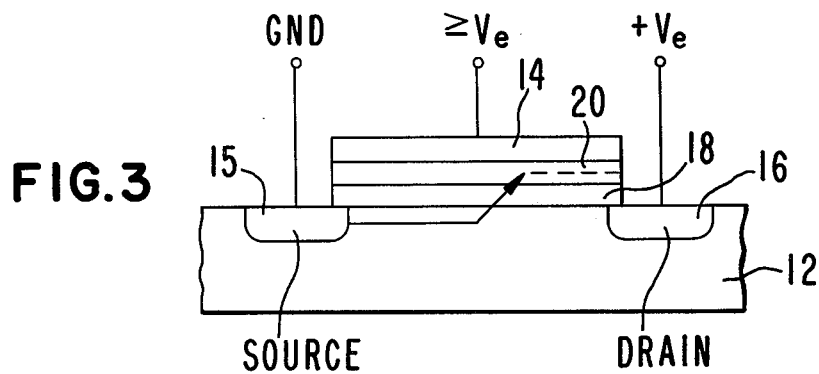
FIG. 3 is a cross-sectional view of an IGFET depicting schematically that electrons flowing between the source and the drain may gain sufficient energy to be injected into and trapped in the gate insulating material.

FIG. 3 is a simplified cross-sectional view of an IGFET. The transistor includes a substrate 12, a source region 15, a drain region 16, insulating layers 18 and 20, and gate electrode 14. MOS transistors like that depicted in FIG. 3 are well known. Such transistors may be fabricated utilizing a p conductivity type substrate 12, n type source region 15 and n type drain region 16. Insulating layers 18 and 20 may be any suitable material, but typically layer 18 will be silicon dioxide and layer 20 will be silicon nitride. Gate electrode 14 will be an electrically conductive material, for example, polycrystalline silicon or metal.

It has been discovered that by biasing the IGFET transistor structure shown in FIG. 3 with a positive voltage on the drain 16, a substantially equal or larger positive voltage, typically pulsed, on the gate electrode 14, and a lesser voltage, typically ground, on the source 15, that electrons flowing between the source and drain can acquire a sufficient energy to be injected into the gate insulating regions 18 and 20. Abbas and Dockerty, supra, report that the electrons flowing between the source 15 and drain 16 may undergo direction randomizing scatterings which cause some of them to move in the direction of the interface between the silicon dioxide layer 18 and substrate 12. Some of the electrons moving in this direction will have sufficient energy to travel from the silicon substrate 12 into the gate insulating materials 18 and 20, where they are trapped. The effect is shown schematically in FIG. 3 by the arrow and minus signs, representing the path of an electron and the locations of previously trapped electrons, respectively. The number of electrons trapped will depend on numerous factors as elaborated by Abbas and Dockerty. Principal factors, however, are the number of electrons injected, the number of sites available for the trapping and their capture cross-section. Silicon nitride 20 is known to have a much greater trapping efficiency than silicon dioxide layer 18, and consequently most of the electrons being injected into the gate insulating layers 18 and 20 will lodge in silicon nitride layer 20. The momentum of the electrons will cause most to be trapped nearer drain 16 than source 15. FIG. 3 shows schematically by the "—" signs that most electrons are trapped in layer 20 near drain 16.

The exact number of electrons which must be trapped is not critical as long as the number is sufficient to allow the difference between the programmed and unprogrammed states to be detected electrically. Useful threshold voltage changes for programming can be created in periods on the order of milliseconds with gate and drain voltages on the order of 15 to 20 volts. Five volts is sufficient for subsequent circuit operation.

Figure 4:
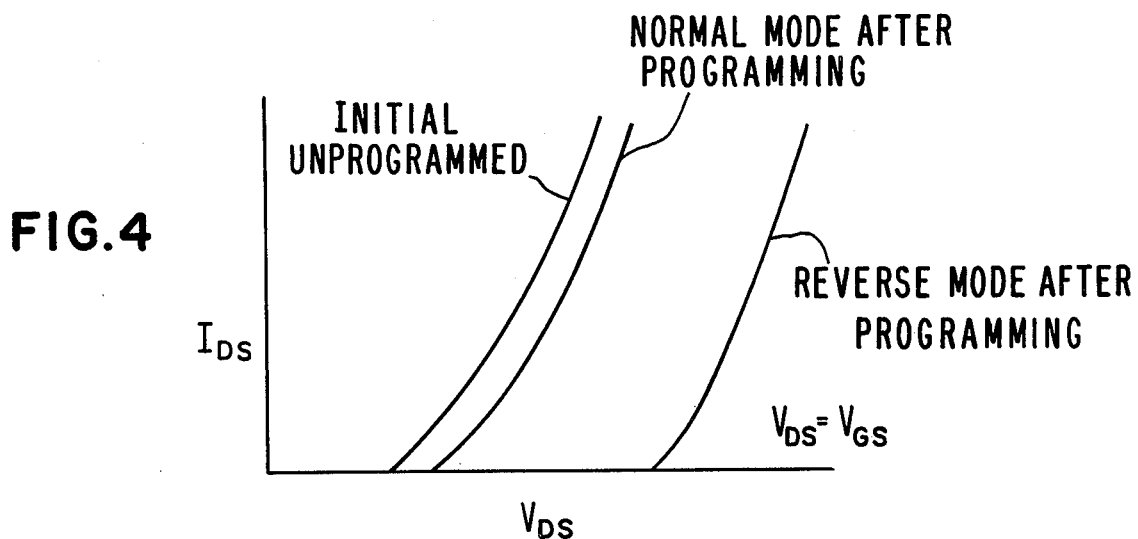
FIG. 4 is a graph showing how the current-voltage characteristics of the IGFET may be altered by hot electron trapping.

The effect of the trapped electrons upon the operating characteristics of the IGFET is shown in FIG. 4. The current-voltage curve for the IGFET which has not been programmed, that is, which has not had electrons injected into its gate insulating regions 18 and 20, is designated in FIG. 4 by the curve marked "initial unprogrammed." If after programming the structure by injecting electrons into the gate insulator 18 and 20, the IGFET is operated in the same direction as it was programmed, the relationship between current and voltage will be shifted slightly to the right. That is, a given voltage causes a slightly smaller current than for an unprogrammed device. This is shown in FIG. 4 by the curve designated "normal mode after programming." The shift in current-voltage characteristics after programming, however, may be made most pronounced if the IGFET is operated in the reverse mode, that is, with the source and drain polarities reversed. This effect is also shown in FIG. 4, where the current-voltage relationship for the device after programming when operated in a reverse condition is shown by the curve designated "reverse mode after programming." By operating the device in a reverse mode after programming, a substantially greater voltage is required to produce a given current than in either the "initial unprogrammed" condition or the "normal mode after programming" condition. It is this substantial change in the current-voltage relationship which may be used to change the "state" of selected transistors within a memory to thereby store information for later recall during "reading" of the memory.

Figure 5:
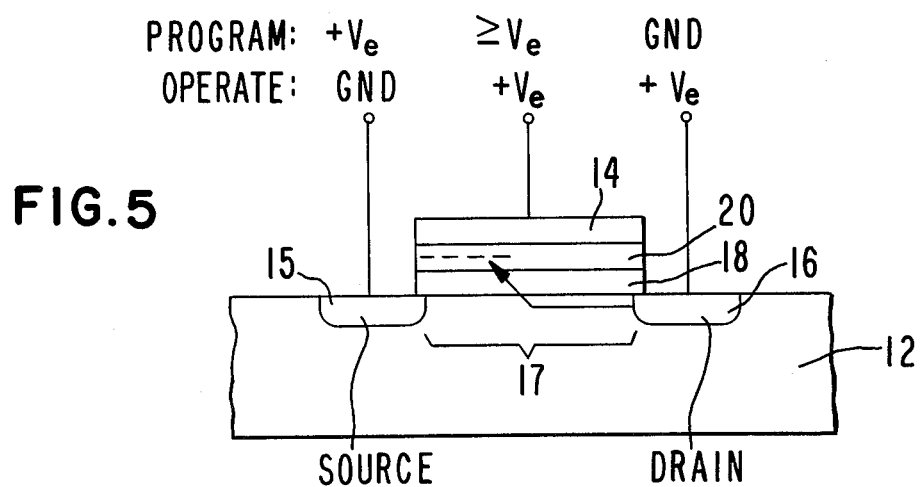
FIG. 5 is a schematic diagram of a single IGFET showing the potentials applied to its source, drain, and gate for both programming and operating the IGFET.

A cross-sectional view of an IGFET programmed and operated according to one embodiment of applicants' invention is shown in FIG. 5. FIG. 5 depicts an IGFET which includes a gate electrode 14, a source region 15, a drain region 16, and gate insulating regions 18 and 20. The source and drain will be one conductivity type, while the substrate is opposite conductivity. A structure such as that depicted in FIG. 5 would form a single cell of a ROM, PROM, or EPROM. To program the memory cell shown in FIG. 5, selected voltages are applied to the source and gate electrode, while a lower voltage is applied to the drain. The voltage applied to the gate is pulsed in some embodiments. The applied voltages cause electrons to flow from the drain 16 through the channel 17 in substrate 12 and toward the source 15. In the manner previously described, some of the electrons will be injected into the gate insulating regions 18 and 20. If region 18 is silicon dioxide and region 20 is silicon nitride, then, because of the trapping characteristics of these two materials, most of the electrons injected will be trapped in silicon nitride region 20. Further, because the electrons are flowing toward source 15, most will be trapped near that end of the silicon nitride layer 20. The information stored in the cell may be sensed by changing the polarity of the source and drain, that is, by biasing the drain 16 to a higher voltage than the source 15, and then detecting the shift of current-voltage characteristics. It will be apparent to those skilled in the semiconductor arts that the cell may be programmed by applying a higher voltage to the drain 16 than the source 15, and then reversing this for reading. The determination of which region is the source and which is the drain is a matter of convention.

At least two advantages result from programming the cell in an opposite direction from that in which it is operated. If the cell were not programmed with a polarity opposite to that of the normal reading operation, the threshold voltage shift would be small and difficult to sense. This is shown in FIG. 4 by the relative closeness of the curves designated "initial unprogrammed" and "normal mode after programming." Secondly, by avoiding reversal of the bias voltage, devices in the peripheral control circuitry for a memory utilizing this invention do not suffer unwanted changes in their operating characteristics.

Figure 6A:
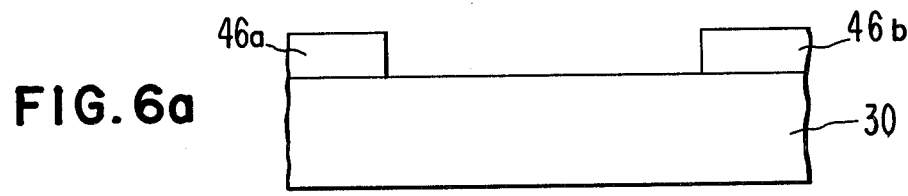
FIGS. 6a through 6d depict one method for forming the structure shown in FIG. 6e.
Figure 6B:
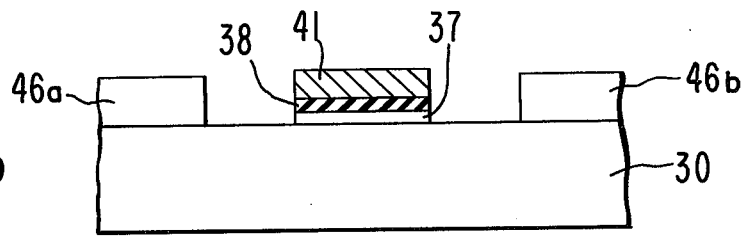
Figure 6C:
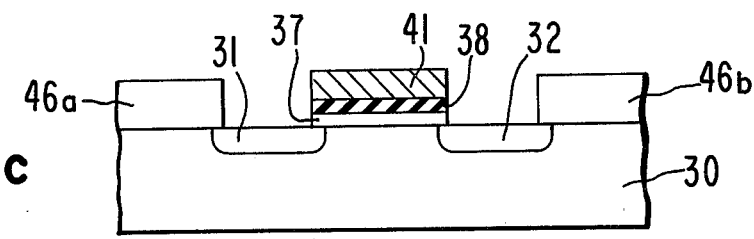
Figure 6D:
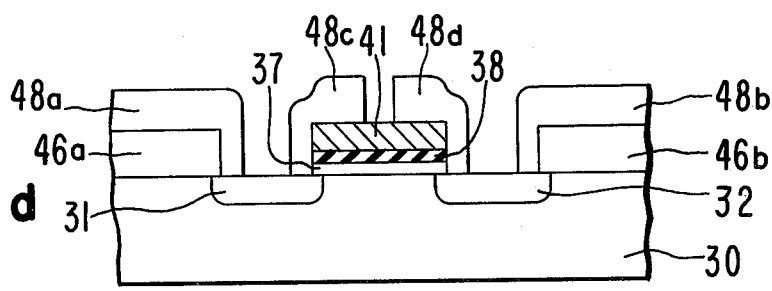
Figure 6E:
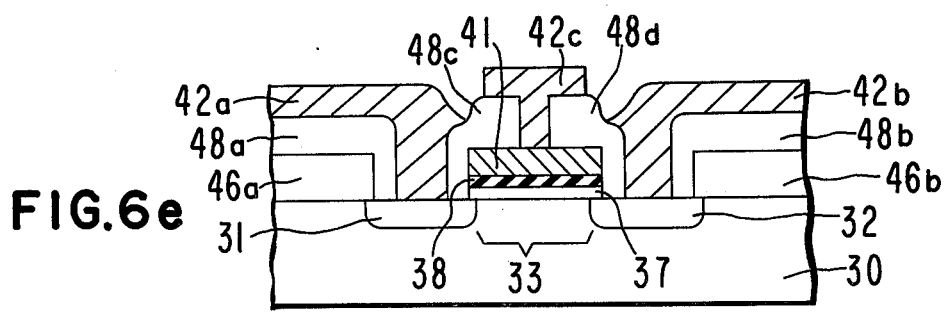
FIG. 6e is a simplified cross-sectional view showing one embodiment of an IGFET memory cell with source, gate, and drain electrodes.

FIG. 6e depicts a cross-section of one embodiment of a single IGFET suitable for use as a ROM, PROM, or EPROM cell. The structure shown in FIG. 6e, like the structures shown in FIGS. 3 and 5, includes a substrate 30, a channel 33, a source 31, and a drain 32. Also shown are silicon dioxide 37 and silicon nitride 38 gate insulating regions, gate electrode 41, and ohmic contact 42a to source 31, contact 42b to drain 32, and contact 42c to electrode 41. Because the structure shown in FIG. 6e may be fabricated utilizing conventional semiconductor processing techniques, its manner of fabrication is only briefly discussed herein.

One method of fabricating the semiconductor structure shown in FIG. 6e is shown in FIGS. 6a through 6d. According to this technique, an insulating region 46, for example, one micron thick thermally-formed silicon dioxide, is formed on the upper surface of a semiconductor substrate 30. In one embodiment substrate 30 is p conductivity type semiconductor material of 5 ohms per centimeter resistivity. Utilizing well-known photolithographic and etching techniques, the thick insulating region is patterned. As shown in FIG. 6a, a section of the insulating material 46 has been removed, leaving two smaller regions 46a and 46b of insulating material. The region of substrate 30 between insulating regions 46a and 46b is used to form one embodiment of the memory cell of this invention. As shown in FIG. 6b, gate dielectric regions 37 and 38 are formed next. One technique for fabricating the gate dielectric is to form a layer of silicon dioxide 37, on the upper surface of which is formed a layer of silicon nitride 38, also typically about 350 angstroms thick, which may be heat-treated for stabilization. Silicon nitride layer 38 will retard or prevent the formation of further silicon dioxide 37 beneath it during subsequent fabrication steps. A polycrystalline silicon layer 41, typically about 5000 angstroms thick, is then deposited on the upper surface of silicon nitride layer 38. Then by forming a further layer of oxide (not shown) on the surface of the polycrystalline silicon and patterning the oxide layer, a mask may be formed. Selected chemical etching solutions may then be applied to remove undesired portions of the polycrystalline silicon 41, silicon nitride 38, and silicon dioxide 37. The resulting structure is shown in FIG. 6b, in which the gate insulating regions 37 and 38 and the electrode 41 have been patterned to allow formation of source 31 and drain 32 regions in two noncontiguous regions of substrate 30.

As shown in FIG. 6c, n conductivity type impurities are then diffused, implanted or otherwise introduced into the exposed portions of substrate 30 and polycrystalline silicon layer 41. These n-type regions form source region 31 and drain region 32. The impurities also cause polycrystalline silicon 41 to become electrically conductive.

Next, as shown in FIG. 6d, a thick insulating layer 48, typically silicon dioxide, which is generally phosphorus doped and about one micron thick, is formed across the surface of the semiconductor structure, and openings are made by well-known semiconductor processing techniques to allow ohmic connections to source 31, drain 32, and polycrystalline silicon electrode 41. Regions 48a, 48b, 48c and 48d of layer 48 are shown. Finally, a conductive film 42, typically metal, is deposited to a typical thickness of one micron and defined on the surface of the structure to form regions 42a, 42b, and 42c, to provide ohmic contact with source 31, drain 32 and gate electrode 41, respectively.

In another embodiment of this invention, a depletion-mode IGFET is formed by introducing an impurity of the same conductivity as the source and the drain into the channel. Depletion-mode IGFET's may be programmed and sensed in the same manner as the enhancement-mode IGFET's already discussed; however, the necessary voltages will differ.

In some embodiments the information stored in the memory cell of this invention may be removed or erased, thereby allowing the fabrication of EPROM's. The information (presence or absence of trapped electrons) stored in the structure may be removed by removing the trapped electrons from the silicon nitride layer 20. The trapped electrons may be removed using any suitable technique, and one technique is to ground the gate electrode and apply a sufficient potential to the drain to cause avalanche breakdown. The ease with which the avalanche breakdown may be induced in the device may be increased by implanting, diffusing, or otherwise introducing a heavily-doped impurity of the same conductivity type as the substrate into the channel 33 between the source region 31 and the drain region 32, to create a selectively lower breakdown. For example, p+ impurity is used with a p type substrate, while n+ impurity is used with an n type sybstrate. The presence of this impurity also increases the electron injection efficiency into the gate insulation, for example, silicon dioxide layer 37 and silicon nitride layer 38.

In another embodiment of this invention a selected impurity is embedded in the gate insulating region to enhance the trapping capability of the gate insulating region. Trapping sites may be added by increasing the trapping density and/or capture cross-section of the gate insulating region. This may be accomplished by adding an impurity to the gate insulator such as polycrystalline silicon, molybdenum or some other material which is compatible with subsequent process operations. The amount of impurity added will not be sufficient to form a conductive film, for example, as in a FAMOS type structure, but merely enough to increase the density of traps in the insulating material to therefore enhance its trapping capability.

Figure 7:
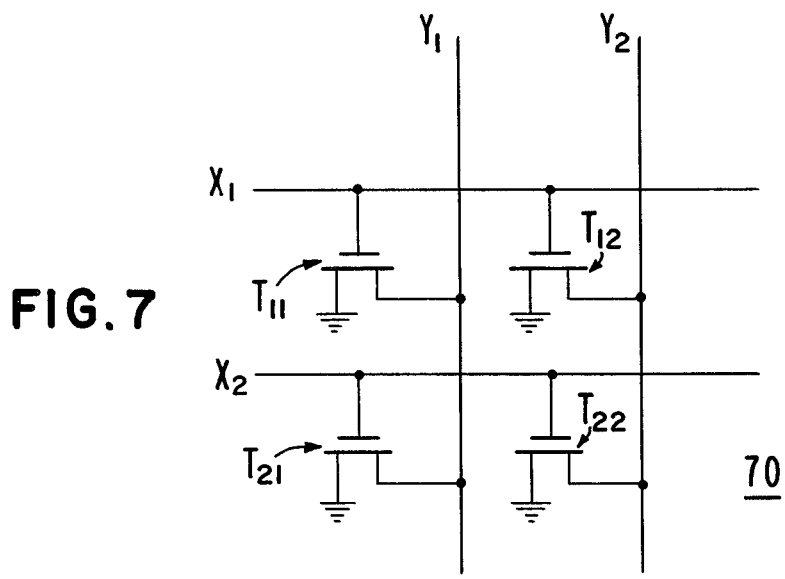
FIG. 7 is a schematic diagram of an array of memory cells of the type shown in FIG. 5 or FIG. 6e.

A schematic diagram of an array 70 of IGFET memory cells of the type depicted in FIGS. 5 and 6e is shown in FIG. 7. Although FIG. 7 depicts an array 70 of four IGFET's, the array can be expanded to any desired size of m rows and n columns, where m and n are positive integers.

In general, an array of arbitrary size arranged like array 70 is programmed by applying electrical signals to (1) a common line (not shown but which connects the grounded terminals of cells $T_{11}$, $T_{12}$, ... $T_{1n}$ $T_{21}$, $T_{22}$ ... $T_{2n}$, ... $T_{m1}$, $T_{m2}$, ... $T_{mn}$, (2) the x lines, and (3) the y lines. The electrical signals are usually applied in an order which first prevents the inadvertent programming of the desired cell and then programs the desired cell. The step which prevents inadvertently programming undesired cells is referred to herein as establishing a "safe" condition.

Those skilled in the semiconductor arts will realize that for any given memory array a plurality of methods of establishing a "safe" condition may exist. For example, array 70 is in a safe condition when both of the following conditions do not exist simultaneously:
1. The source and drain are at different potentials.
2. The gate potential is equal to or higher than the greater of the source of the drain potential.

In some embodiments of the invention, however, brief periods of an unsafe condition may be permitted. For example, in certain embodiments of the memory cell shown in FIG. 6e in which prolonged high voltages or numerous repeated pulses must be applied to the gate electrode to program the cell, an unsafe condition may exist for a suitably brief period without programming the cell.

One embodiment of the method of programming a cell in an array arranged like array 70 comprises the following steps:
1. Initialize all lines to a low or ground potential, thereby placing all cells in a safe condition.
2. Apply a high potential, for example, $V_e$, to the common line connecting all the sources.
3. Apply a high potential, e.g., $V_e$, or let float all nonselected y lines.
4. Apply a high potential, which may be a pulsed signal, greater than or equal to that applied in step 2 to the selected x lines.

The foregoing steps cause only the one cell connected to the selected x and y lines within array 70 to be programmed. The first step places all cells within the array 70 in a safe condition, thereby preventing inadvertently programming nonselected cells. The second step allows any cell within the array to be programmed. The third step prevents programming all of the transistors in the array except those connected to the desired y line. (This step also permits the transistors connected to the desired y line to be programmed depending upon the potential applied to their respective gate electrodes.) Finally, the application of the high potential to the selected x line results in the programming of a single desired transistor, $T_{xy}$, within the array 70. The foregoing procedure may be utilized repeatedly to program any number of transistors in an array 70 of arbitrary size.

To read information from a selected cell or transistor within the array:
1. Apply a low or ground potential to the sources of all the transistors, and 2. Raise a single x line and a single y line to the desired high potential.

These conditions cause a current to appear on the y line dependent upon the previous programming, which current may be detected and interpreted as a logical zero or a logical one.

Figure 8:
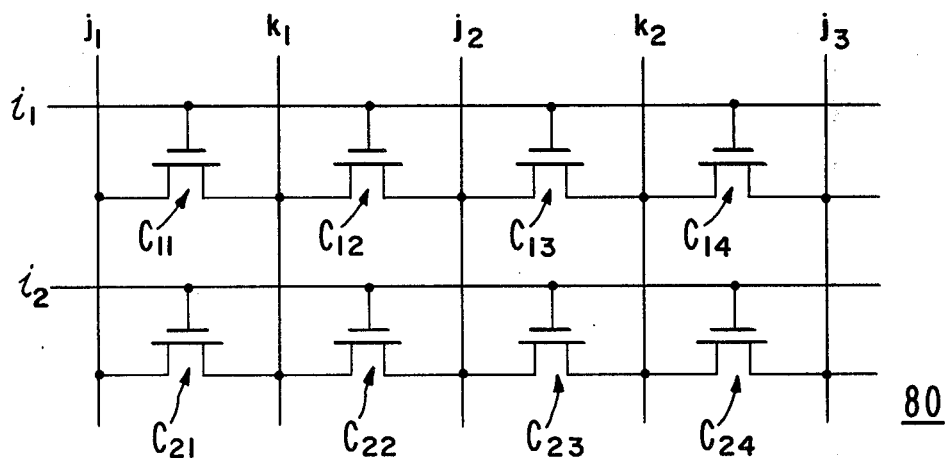
FIG. 8 is a schematic diagram of another array of memory cells of the type shown in FIG. 5 or FIG. 6e.

Another embodiment of an array of IGFET's which may be programmed and operated according to this invention is depicted in FIG. 8. FIG. 8 shows an array 80 of eight IGFET's in what is sometimes referred to as a virtual ground read-only memory arrangement.

The j lines shown in FIG. 8 will be referred to as the virtual ground lines because they are selectively grounded or held at low potential when the memory array 80 is being read. The k lines of array 80 are referred to as the sense lines and, in the embodiment shown in FIG. 8, alternate with the j lines. The gates of the cells of array 80 are connected to the i lines, while the sources and drains are connected to the j and k lines, respectively.

In one embodiment of the method hereof, information may be programmed into a transistor, for example, $C_{23}$, within an array arranged like array 80 by the following steps:

1. Initialize all i, j and k lines to a low or ground potential, thereby placing all cells in a safe condition.
2. Apply a high potential, e.g., $V_e$, to the virtual ground line j connected to the desired cell, e.g., $j_2$.
3. Let float, or apply a high potential, e.g., $V_e$, to all j and k lines which are on the same side of the k line connected to the desired cell as is the j line selected in step 2, e.g., $j_1$ and $k_1$.
4. Let float, or apply a low or ground potential, to all j and k lines which are on the same side of the j cone connected to the desired cell as the k line connected to the desired cell, e.g., $j_3$.
5. Apply a high potential, which may be pulsed, at least equal to that applied in step 2, e.g., $V_e$, to the i line connected to the desired cell, e.g., $i_2$.

The high potential on $i_2$ and $j_2$ together with the ground or low potential of line $k_2$ causes electrons to be injected into the gate insulating region of cell $C_{23}$, thereby programming it in the manner already described herein.

The information stored within a single cell of array 80 may be retrieved or read in a similar fashion. One such method comprises the following steps:

1. Initialize all i, j and k lines to a low or ground potential.
2. Raise the i line connected to the desired cell to a chosen high potential.
3. Allow all j and k lines on the side of the cell opposite the j line connected to the cell to float.
4. Raise the selected sense line k to a chosen high potential, e.g., $V_e$.

The information stored within the selected cell may be sensed by detecting and interpreting the current on the selected sense line j as a logical one or zero.

Although the foregoing invention has been described in part in terms of particular conductivity types, embodiments or methods, it will be appreciated by those skilled in the semiconductor and circuit-design arts that different materials or methods of equivalent function, including opposite conductivity types, may be substituted for those referred to herein.

What is claimed is:

1. A semiconductor memory cell comprising:
   an insulated gate field-effect transistor (IGFET) having a substrate of first conductivity type;
   spaced-apart source and drain regions formed in the substrate, each of opposite conductivity to the substrate;
   a gate insulating region formed on the substrate between the source and the drain, the gate insulating region including means for trapping charge therein;
   an electrically conductive gate electrode formed on the gate insulating region between the source and the drain;
   means for defining a state in the IGFET by applying a first signal to the gate electrode, a second signal to the source, and a third signal to the drain, wherein the potential of each of the first and second signals is greater than the potential of the third signal, to introduce charge nonuniformly into the gate insulating region predominantly toward the source region, and store charge nonuniformly in the gate insulating region in the means for trapping charge predominantly toward the source region; and
   means for detecting the state defined in the IGFET by applying a fourth signal to the gate electrode, a fifth signal to the source, and a sixth signal to the drain, wherein the potential of each of the fourth and sixth signals is greater than the potential of the fifth signal.

2. A semiconductor memory cell as in claim 1 wherein the potential of the first and the second signals are substantially equal.

3. A semiconductor memory cell as in claim 2 wherein the third signal is ground potential.

4. A semiconductor memory cell as in claim 1 wherein the first signal is a pulsed signal of varying potential.

5. A semiconductor memory cell as in claim 1 wherein the potential of the fourth and the sixth signals are substantially equal.

6. A semiconductor memory cell as in claim 5 wherein the fifth signal is ground potential.

7. A semiconductor memory cell as in claim 1 wherein the potential of the first, second, fourth, and sixth signals is the same.

* * * * *